(12) United States Patent
Van Dijsseldonk et al.

(10) Patent No.: US 6,967,756 B2
(45) Date of Patent: Nov. 22, 2005

(54) LITHOGRAPHIC APPARATUS DEVICE MANUFACTURING METHOD AND DEVICE MANUFACTURED THEREBY

(75) Inventors: Antonius Johannes Josephus Van Dijsseldonk, Hapert (NL); Erik Roelof Loopstra, Heeze (NL); Dominicus Jacobus Petrus Adrianus Franken, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/834,834

(22) Filed: Apr. 30, 2004

(65) Prior Publication Data
US 2004/0202898 A1   Oct. 14, 2004

Related U.S. Application Data

(63) Continuation of application No. 09/902,490, filed on Jul. 11, 2001, now Pat. No. 6,765,712.

(30) Foreign Application Priority Data
Jul. 13, 2000   (EP) .................................. 00305958

(51) Int. Cl.⁷ ....................... G02B 26/08; G02B 26/00; G02B 7/182
(52) U.S. Cl. ....................... 359/198; 359/291; 359/849
(58) Field of Search .................................. 359/198, 224, 359/290, 291, 298, 846, 849; 250/492.1, 250/492.2, 492.22

(56) References Cited

U.S. PATENT DOCUMENTS

| | | | |
|---|---|---|---|
| 4,066,343 A | 1/1978 | Scott ........................... 359/849 |
| 4,196,972 A | 4/1980 | Rawlings ..................... 359/849 |
| 4,226,507 A * | 10/1980 | Fuschetto .................... 359/849 |
| 4,480,892 A * | 11/1984 | Ishikawa ...................... 359/18 |
| 4,655,563 A | 4/1987 | Plante et al. ................. 359/849 |
| 4,944,580 A | 7/1990 | MacDonald et al. ......... 359/849 |
| 5,142,132 A | 8/1992 | MacDonald .............. 250/201.9 |
| 5,420,436 A | 5/1995 | Seya et al. ................ 250/492.1 |
| 5,986,795 A | 11/1999 | Chapman et al. ........... 359/224 |

\* cited by examiner

*Primary Examiner*—Georgia Epps
*Assistant Examiner*—William Choi
(74) *Attorney, Agent, or Firm*—Pillsbury Winthrop Shaw Pittman LLP

(57) ABSTRACT

A lithographic projection apparatus includes an active reflector in a radiation system providing a projection beam of radiation and/or in a projection system. The active reflector includes a body member, a reflective multilayer and at least one actuator controllable to adjust the surface figure of the reflecting multilayer, wherein the actuator exerts a substantial force component in a direction parallel to the surface figure of said reflective multilayer. The actuator may be operative to apply torques to said reflector.

34 Claims, 3 Drawing Sheets

Fig.4.
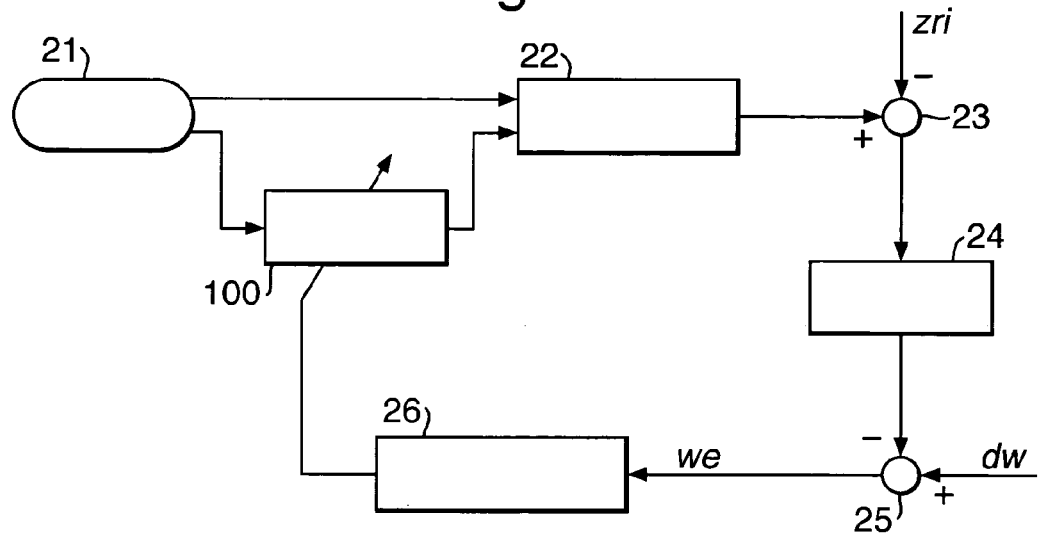
Fig.5.
|  | A | B | C |
|---|---|---|---|
| 0 | 363 | 57.9 | 35.3 |
| 1 | 16 | 11.0 | 7.8 |
| 9 | 2.4 | 2.1 | 1.9 |
| 16 | 0.77 | 0.67 | 0.54 |
| 25 | 0.34 | 0.30 | 0.29 |
| 36 | 0.18 | 0.16 | 0.16 |
| 100 | 0.03 | 0.03 | 0.03 |
| 400 | 0.004 | 0.004 | 0.003 |
Fig.6.
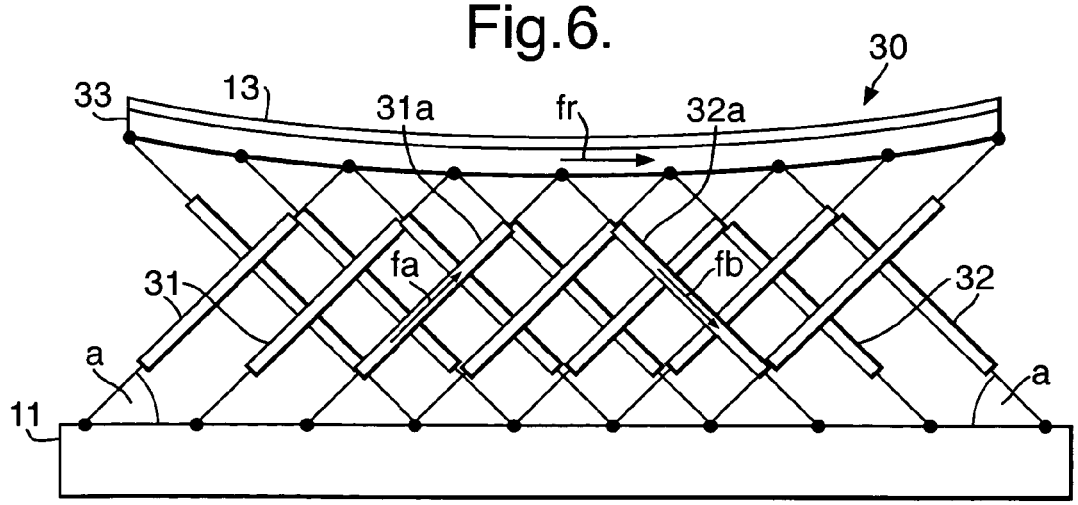

LITHOGRAPHIC APPARATUS DEVICE MANUFACTURING METHOD AND DEVICE MANUFACTURED THEREBY

CROSS-REFERENCE TO RELATED APPLICATIONS

This is a continuation application of U.S. application Ser. No. 09/902,490, filed Jul. 11, 2001, now U.S. Pat. 6,765,712 which in turn claims priority from European Patent Application No. 00305958.1, filed Jul. 13, 2000, both of which are herein incorporated by reference in their entireties.

BACKGROUND OF THE INVENTION

1. Field of the Invention

The present invention relates generally to a lithographic projection apparatus and more specifically to a lithographic projection apparatus including a controllable reflector.

2. Background of the Related Art

The term "patterning structure" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning structure include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-adressable surface. The required matrix addressing can be performed using suitable electronic means. More information on such mirror arrays can be gleaned, for example, from U.S. Pat. Nos. 5,296,891 and 5,523,193, which are incorporated herein by reference. In the case of a programmable mirror array, the said support structure may be embodied as a frame or table, for example, which may be fixed or movable as required; and A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning structure as hereabove set forth.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

In a lithographic apparatus the size of features that can be imaged onto the wafer is limited by the wavelength of the projection radiation. To produce integrated circuits with a higher density of devices, and hence higher operating speeds, it is desirable to be able to image smaller features. While most current lithographic projection apparatus employ ultraviolet light generated by mercury lamps or excimer lasers, it has been proposed to use shorter wavelength radiation of around 13 nm. Such radiation is termed extreme ultraviolet (XUV or EUV) or soft x-ray and possible sources include laser-produced plasma sources, discharge plasma sources or synchrotron radiation from electron storage rings. An outline design of a lithographic projection apparatus using synchrotron radiation is described in "Synchrotron radiation sources and condensers for projection x-ray lithography", J B Murphy et al, Applied Optics Vol. 32 No. 24 pp 6920–6929 (1993).

Lithographic projection apparatus using EUV radiation are intended to image mask patterns with a critical dimension of 90 nm or less. This imposes extremely severe accuracy criteria on the illumination and especially the projection optics. For the projection system, the required accuracy is defined by the wavefront aberration (WFA) which is twice the magnitude of the surface figure error. For a four-mirror system it has been calculated (Gwyn, C. W. et al, Extreme Ultraviolet lithography, J. Vac. Sci. Technol. B 16, (November/December) 1998, pp 3142) that a WFA tolerance of $\leq 1$ nm rms is required for low frequency errors, i.e. those of spatial wavelength of greater than 1 mm. Independent errors of each mirror must therefore be no greater than 0.25 nm, since in a system of N mirrors the maximum permissible error of each mirror is $(2\sqrt{N})^{-1}$ times the total error for the system. For mid-spatial frequency errors, of wavelength 1 mm to 1 $\mu$m, surface roughness must be less than 0.2 nm rms as roughness in this spatial frequency range reduces image contrast. High-spatial frequency errors, of wavelength less than 1 $\mu$m, cause large angle scattering, a loss mechanism for the beam, and so surface roughness for these frequencies must be less than 0.1 nm rms.

U.S. Pat. No. 5,986,795 and U.S. Pat. No. 5,420,436 both disclose the use of adaptive mirrors in photolithography using EUV radiation. In the mirror described in U.S. Pat. No. 5,986,795, a number of actuators are provided between a reaction plate and a face plate bearing a reflective coating suitable for the radiation used in the lithography apparatus. The actuators may be piezoelectric, electroresistive or magnetoresistive and act generally perpendicularly to the face and reaction plates. The reaction plate is more flexible than the face plate. U.S. Pat. No. 5,420,436 describes a similar arrangement, having an array of piezoelectric actuators acting perpendicularly between a reaction plate and a face plate; in this case however the face plate is more flexible than the reaction plate.

SUMMARY OF THE INVENTION

An embodiment of the present invention provides an adaptive reflector or system of reflectors, especially for extreme ultraviolet radiation, that can provide improved control over the surface figure of the mirror and hence over wavefront aberration.

One aspect of the present invention includes a lithographic projection apparatus including a radiation system for providing a projection beam of radiation, a support structure for supporting patterning structure, the patterning structure serving to pattern the projection beam according to a desired pattern, a substrate table for holding a substrate, a projection system for projecting the patterned beam onto a target portion of the substrate; and an active reflector comprised in an optical system being either one or both of said radiation system and said projection system, said active reflector comprising a body member, a reflective multilayer and at least one actuator controllable to adjust the surface figure of said reflective multilayer, wherein said actuator exerts a substantial force component in a direction parallel to the surface figure of said reflective multilayer.

The actuator in the active mirror serves to control the surface figure of the reflective multilayer and hence can be used to minimize wavefront aberration in the radiation beam delivered by the optical system. Stress, and particularly stress variations, have been identified as a major source of surface figure errors in reflectors adapted to reflect EUV radiation and the invention can directly compensate for this. The present invention can be used to compensate for stress inherent in the multilayer as a result of its manufacture as well as stresses caused by external factors. The actuators may be piezoelectric stack or patch actuators and are preferably incorporated into the reflector body close to the reflecting multilayer.

The actuators exert a substantial component of force in a direction parallel to the surface figure of the multilayer. In the case of a significantly curved mirror the force component should be parallel to the surface figure at or near the point of connection between the actuator and the multilayer or the member bearing the multilayer. The stiffness of the multilayer, or a member bearing the multilayer, is higher in directions parallel to the surface figure than in the direction perpendicular to the surface figure (note that in a local coordinate system having orthogonal x, y and z axes describing the mirror, the direction perpendicular to the surface figure at the center of the mirror may be referred to as the z-direction.). This means that a given force exerted parallel to the plane of the reflector effects a smaller deformation of the surface figure than the same force exerted perpendicularly. Since the required deformations are very small and actuators of the required strength are easily obtained, the present invention allows for a much more exact control of the surface figure, with reduced risk of over-deforming the mirror.

The actuators may lie wholly in the plane of the reflector, particularly where the actuators are patch actuators. However, the actuators may also be rod actuators arranged diagonally between the reflective layer and base member. In such an arrangement, the actuators may be arranged in pairs connected to the reflective layer at the same point but to the base plate at spaced-apart locations and controlled so that the resultant force exerted by each pair on the reflector layer lies wholly within the plane of the reflector. It is also possible for the actuators to be connected singly but in that case it is preferred that of the force exerted by each actuator on the surface figure, the component perpendicular to the surface is less than 50% and preferably less than 20% of the total force exerted by that actuator.

The actuators may also be arranged such that they are operative to apply torques to said active reflector so as to locally bend the reflective surface of the multilayer for controlling the surface figure. Applying torques proves very efficient in controlling the surface figure and advantageously the torques are about a point in or near the reflective multilayer. Torques may be applied by exerting the forces on projections of the active reflector at a backside opposing the reflective multilayer. In an embodiment the actuators applying the forces that induce the torques are arranged in between projections. The projections may be walls of cavities at the backside of the active reflector and a pneumatic or hydraulic pressure can be applied to the cavities so as to form pneumatic or hydraulic actuators applying forces to the projections. Generally, the projections will be substantially perpendicular to the surface figure and the forces exerted on the projections parallel to the surface figure.

According to a further aspect of the invention there is provided a device manufacturing method including projecting a patterned beam of radiation onto a target portion of a layer of radiation-sensitive material on a substrate, wherein at least one of a radiation system for producing the beam and a projection system for projecting the beam include an active reflector that includes a body member, a reflective multilayer and at least one actuator controllable to adjust the surface figure of said reflecting multiplayer, wherein said actuator exerts a substantial force component in a direction parallel to the surface figure of said reflective multilayer and controlling said active reflector to minimize wavefront aberration in a radiation beam reflected by said active reflector.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (XUV or EUV) radiation (e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 4 is a diagram of a control system used in the first embodiment of the invention;

FIG. 5 is a table of results of two examples of the present invention compared with a static mirror;

FIG. 6 is a cross-sectional view of an active mirror used in a second embodiment of the invention;

DETAILED DESCRIPTION

Embodiment 1

Figure 1:
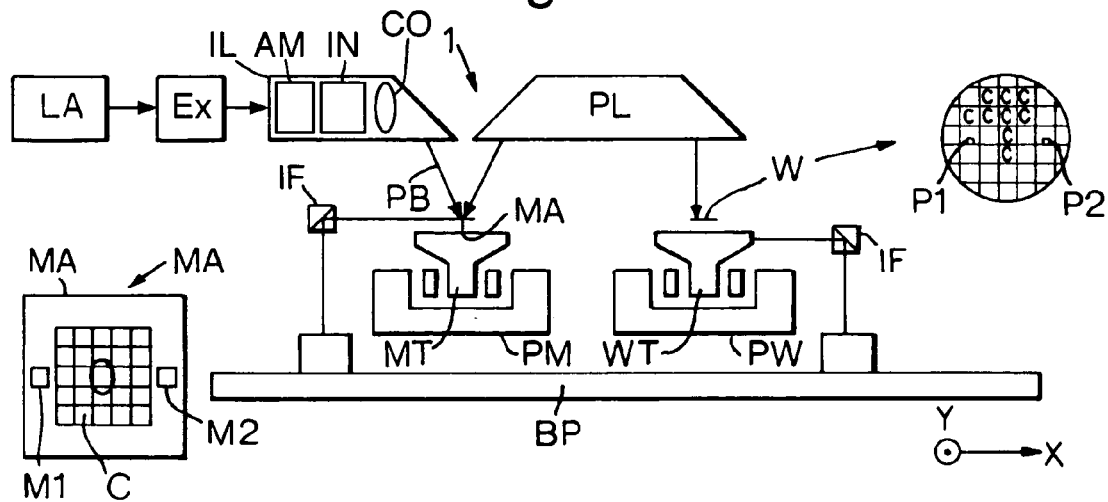
FIG. 1 depicts a lithographic projection apparatus according to a first embodiment of the invention.

FIG. 1 schematically depicts a lithographic projection apparatus according to a particular embodiment of the invention. The apparatus comprises:

A radiation system Ex, IL, for supplying a projection beam PB of radiation (e.g. UV or EUV radiation). In this particular case, the radiation system also comprises a radiation source LA;

A first object table (mask table) MT provided with a mask holder for holding a mask MA (e.g. a reticle), and connected to first positioning means PM for accurately positioning the mask with respect to item PL;

A second object table (substrate table) WT provided with a substrate holder for holding a substrate W (e.g. a resist-coated silicon wafer), and connected to second positioning means PW for accurately positioning the substrate with respect to item PL; and A projection system ("lens") PL (e.g. a reflective or a catadioptric system) for imaging an irradiated portion of the mask MA onto a target portion C (e.g. comprising one or more dies) of the substrate W.

As here depicted, the apparatus is of a reflective type (i.e. has a reflective mask). However, in general, it may also be of a reflective type, for example (with a transmissive mask). Alternatively, the apparatus may employ another kind of patterning structure, such as a programmable mirror array of a type as referred to above.

The source LA (e.g. an excimer laser, a laser-produced plasma source or a discharge plasma source) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having been selectively reflected by the mask MA, the beam PB passes through the lens PL, which focuses the beam PB onto a target portion C of the substrate W. With the aid of the second positioning means PW (and interferometric measuring means IF), the substrate table WT can be moved accurately, e.g. so as to position different target portions C in the path of the beam PB. Similarly, the first positioning means PM can be used to accurately position the mask MA with respect to the path of the beam PB, e.g. after mechanical retrieval of the mask MA from a mask library, or during a scan. The reference signs M1, M2 correspond to reticle alignment marks and the references P1 and P2 correspond to wafer alignment marks. These marks are used to respectively align the wafer and the reticle respective to each other. In general, movement of the object tables MT, WT relative to a base plate BP will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

In step mode, the mask table MT is kept essentially stationary, and an entire mask image is projected at once (i.e. a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V= Mv, in which M is the magnification of the lens PL (typically, M=¼ or ⅕). In this manner, a relatively large target portion C can be exposed, without having to compromise on resolution.

Figure 2:
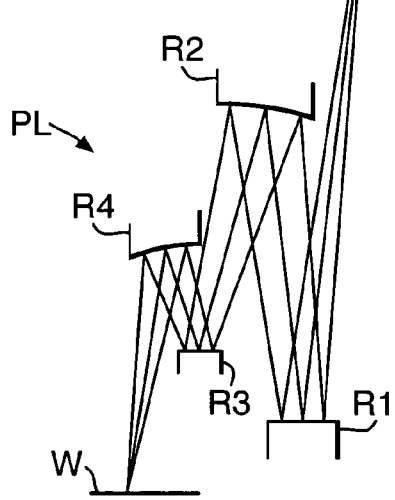
FIG. 2 is a diagram of relevant components of the projection optics of the first embodiment.

As shown schematically in FIG. 2, projection system PL comprises a set of mirrors (reflectors) R1 to R4 which collect the exposure radiation reflected from (or transmitted through) the mask MA and focus it onto the wafer W. Further details of the optical design of this system are given in Gwyn et al. (referenced above) which document is incorporated herein by reference. This projection system PL requires mirrors that are thin, especially for mirror R1 which is very close to the wafer.

Figure 3A:
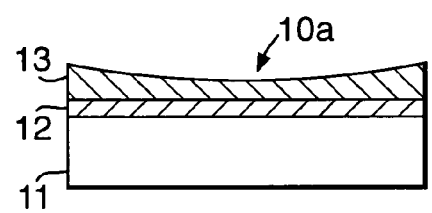
FIGS. 3A to 3C are cross-sections of alternative arrangements of bimorph mirrors usable in the first embodiment of the invention.
Figure 3B:
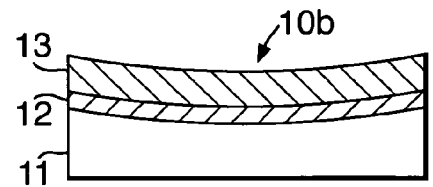
Figure 3C:
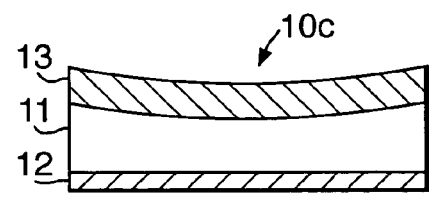

Suitable active mirrors 10a to 10c usable in the projection system PL are shown schematically in FIGS. 3A to 3C. Each mirror essentially comprises a mirror body 11 which provides mechanical support and rigidity, an active layer 12 including the actuators to control the mirror surface configuration and a multilayer coating 13 which forms the actual reflecting surface.

In current designs, the mirror body 11 is relatively thick, e.g. 25 mm or more and up to a third of the lateral extent of the mirror, to avoid surface figure changes due to gravity and stress in the multilayer coating 13. However, by use of the present invention, this can be reduced substantially by using the active control to compensate for changes due to such effects. Preferred materials for the mirror body, whether thick or thin, are the glass, ULE (TM), Zerodur (TM) and aluminum and the body may be solid or, e.g., honeycombed as desired.

The actuator layer 12 is preferably embedded in the mirror body close to the multilayer 13 in order to have a direct influence on the surface figure. FIG. 3A shows such an arrangement whereby the actuator layer 12 is placed between the mirror body 11 and multilayer 12 and has a flat form. The surface figure is formed wholly in the multilayer 13. FIG. 3B is a similar arrangement but with the mirror body 11 and actuator layer 12 having a similar figure to the mirror surface figure. If it is not feasible to embed the actuator layer 12 in the mirror body 11, it can be attached to the bottom of the mirror body 11, as shown in FIG. 3C.

Actuator layer 12 includes a suitable number and arrangement of actuators to effect the desired control over mirror shape; this is discussed further below. The actuators themselves may be of any suitable form and use any suitable actuating principle, e.g. piezoelectricity, electrostriction, magnetostriction or by use of permanent magnet and coil, either moving magnet or moving coil.

Presently, piezoelectric actuators are preferred and, of piezoelectric materials, lead zirconium titanate (PZT) is preferred over polyvinylideen diflouride (PVDF). PZT has high force per unit mass, static force capability, high unconstrained strain/blocked force product, negligible DC resistance, relatively widespread availability, and flexibility in dimensions, materials and electrode configurations, which characteristics make it desirable for use in the present invention.

The actuators included in actuator layer 12 are preferably patch actuators, i.e. thin plate-like bending mode actuators which act as bimorph assemblies when attached to a plate. With such actuators the major principle by which curvature in the assembly is created is the in-plane forces generated in the piezoelectric material. Piezoelectric patch actuators usable in the invention include two major types: actuators in which the electric field is applied in the thickness, i.e. out-of-plane direction; and actuators in which the field is applied in the in-plane direction. One particularly suitable form of the latter type is the Active Fiber Composite (RTM) actuator manufactured by Continuum Control Corporation, Massachusetts, USA. The Active Fiber Composite (AFC) actuator comprises thin rods or fibers arranged in parallel to the in-plane direction with interdigitated electrodes. The distance between the electrodes is relatively large, requiring large voltages, but the capacitance of the actuators is relatively small so currents in operation are likewise small. AFC actuators are active only along their length and have a similar overall efficiency, expressed as the mechanical power delivered to a load divided by the reactive electrical input power, to conventional patch actuators. A particular advantage of AFC actuators in the present invention is their mechanical flexibility which allows them to be applied to surfaces with a relatively large degree of curvature.

The patch actuators used in the invention exert substantially all their operating force in the plane of the multi-layer 13. Since the multilayer 13 has higher in-plane stiffness than out-of-plane stiffness, this arrangement allows more accurate control of the surface figure since a given force will cause a smaller change in the surface figure. Thus the voltage applied to the actuator can be controlled with greater exactitude and any error, e.g. as a result of a non-linear voltage response of the actuator, will cause a smaller error in the surface figure.

The number size, and layout of actuators in the actuator layer 12 is dependent on the precise mirror construction, particularly its size and shape as well as the thickness of the mirror body and the nominal stress in the multi-layer 13. The required accuracy of the controlled surface figure is also important. As a starting point, actuators can be arrayed evenly across the mirror in a suitable regular array. However it is also possible to concentrate actuators in areas of the mirror where surface figure errors contribute disproportionally to wavefront errors or where greater surface figure errors are expected.

A control system for the active mirror of the invention is shown schematically in FIG. 4; this control system is based on interferometer wavefront sensing and a zero reference interferogram, but other sensing principles and references may be employed. A laser source 21 outputs two coherent laser beams of suitable frequency. One beam is passed through the adaptive optical system 100 according to the present invention, e.g. projection system PL, before the two beams are recombined and interfere in interferogram detector 22. The output of interferogram detector 22 is compared to the zero reference interferogram zri by subtractor 23 and the difference supplied to fringe pattern analyzer 24 which provides wavefront information of the beam that has passed through the adaptive optics 100. Subtractor 25 subtracts this wavefront information from the desired wavefront information dw to generate the wavefront error we which is supplied to controller 26. Controller 26 in turn generates drive signals for the actuators of the adaptive optics 100 to minimize the wavefront error.

As alternatives to the above wavefront sensing arrangement it is also possible to sense the surface figure directly, e.g. using an interferometer to directly measure the surface figure via an array of points, or to measure the stress in the multilayer, since it is determined that this is the source of the error. Piezo-electric PVDF sensors integrated into the mirror at a suitable position may be used for this.

The control system for the active mirror can be operated in either on-line or off-line methods. In off-line methods, the actuation forces necessary to correct the mirror surface figures are determined at machine installation and periodically thereafter during maintenance of the machine. In the off-line control method, a recursive approach may be used, whereby a set of control signals is determined as an approximation to correct the surface figure; the wavefront aberration is then measured again and the control signals adjusted to improve the correction. This procedure may be repeated through a number of iterations suitable to meet the necessary tolerances in the optical system.

An on-line control method enables real-time or quasi real-time correction of the mirror surface figures to compensate for changing environmental conditions, e.g. ambient temperature, which may change during an exposure or series of exposures and component drift. For the on-line control, an at-wavelength (i.e. operating at the exposure wavelength) interferometer may be integrated into the projection optics. This interferometer may measure the interferogram during convenient intervals of the exposure process, e.g. during wafer or mask exchange. The data from this can then be used to update the control signals to correct the mirror surface figure(s).

With the invention, it is preferable to control the optical system including the active mirrors as a whole, rather than controlling individual active mirrors separately. In this way errors of one mirror may be optimally corrected by adjusting the surface figure of another and surface figure errors of static mirrors included in the system may also be corrected. In this way it may not be necessary to provide all mirrors included in the system with actuators.

EXAMPLES

The following examples of the first embodiment of the invention are based on analysis of a 400 mm×400 mm mirror on a 25 mm thick mirror body of ULE and a multilayer of 1 $\mu$m total thickness with a nominal stress of 400 MPa.

In the examples, piezo-electric patch actuators operating on the mirror in the in-plane direction are used. The actuator material is conventional PZT with a piezo constant of 166 pC/N in both directions, an effective Young's modulus of $6.3 \times 10^{10}$ Pa, a Poisson ratio of 0.3 and an effective thickness and electrode distance both of 0.19 mm. Square patch actuators cover the entire surface of the mirror in a square array of 1, 9, 16, 25, 36, 100 or 400 actuators. A 10% sinusoidal variation in the nominal stress in the multilayer is assumed.

The results of the examples are shown in FIG. 5. The first column shows the number of actuators, with the first row being a corresponding arrangement with no actuation for comparison. In column A, the rms surface figure error in nm is given. It can be seen that even a single actuator gives a substantial improvement and that the rms error improves rapidly with additional actuators.

In column A the total error is given. It can be shown that for wavefront errors the surface figure can be decomposed into characteristic Seidel shapes of which piston, tip/tilt and focus are the lowest order terms. A mirror mount adjustable in 6 degrees of freedom can compensate for these low order terms. Accordingly, column B in FIG. 5 gives results assuming that the piezoelectric actuators according to the invention only compensate for the higher order errors. As can be seen, if low order errors are corrected by the mirror mount, the comparison, without control, value is much improved, but the introduction of actuators according to the invention still results in significant improvements, increasing with the number of actuators.

Many projection systems will not make use of the entire mirror surface; assuming a 20% unused freeboard and low order correction via the mirror mount, results are given in column C of FIG. 5. Again substantial improvements in surface figure are provided with increasing numbers of actuators.

Embodiment 2

In a second embodiment of the invention, which may be the same as the first embodiment save as described below, stack actuators acting diagonally are used.

Stack actuators used in the second embodiment of the present invention comprise rod-like actuators arrayed diagonally to the mirror surface and acting along their lengths. Though generally necessitating a bulkier construction than patch actuators, stack actuators can use multiple electrodes along their length to reduce the driving voltages and can be used if linear motion with large concentrated forces is required. Stack actuators also allow any surface figure to be controlled.

A mirror 30 employing stack actuators and used in the second embodiment of the invention is shown in FIG. 6. In this mirror, two arrays of oppositely inclined actuators 31, 32 are connected diagonally between base plate 11 and the reflective member 33, which comprises a multilayer 13 provided on a suitable substrate. The angle of inclination, a, of the actuators is preferably less than about 60° and most preferably less than about 45°. At least in part of the mirror, the actuators 31, 32 are arranged in pairs so that two oppositely inclined actuators 31a, 32a are connected to the reflective member 33 at the same point. With this arrangement, one actuator 31a can be arranged to exert an expansive force, fa, and the other actuator 32 a compressive force, fb, of equal magnitude so that the resultant force, fr, is wholly in the plane of the mirror. A similar effect can be achieved even where the angles of inclination of the actuators are not equal by suitable adjustment of the magnitudes of the forces applied.

In addition to the diagonal actuators, some perpendicular actuators may also be included, e.g. for compensating for perpendicular components of the forces exerted by the diagonal actuators. Combinations of patch, diagonal and/or perpendicular actuators may also be used.

Embodiment 3

Figure 7:
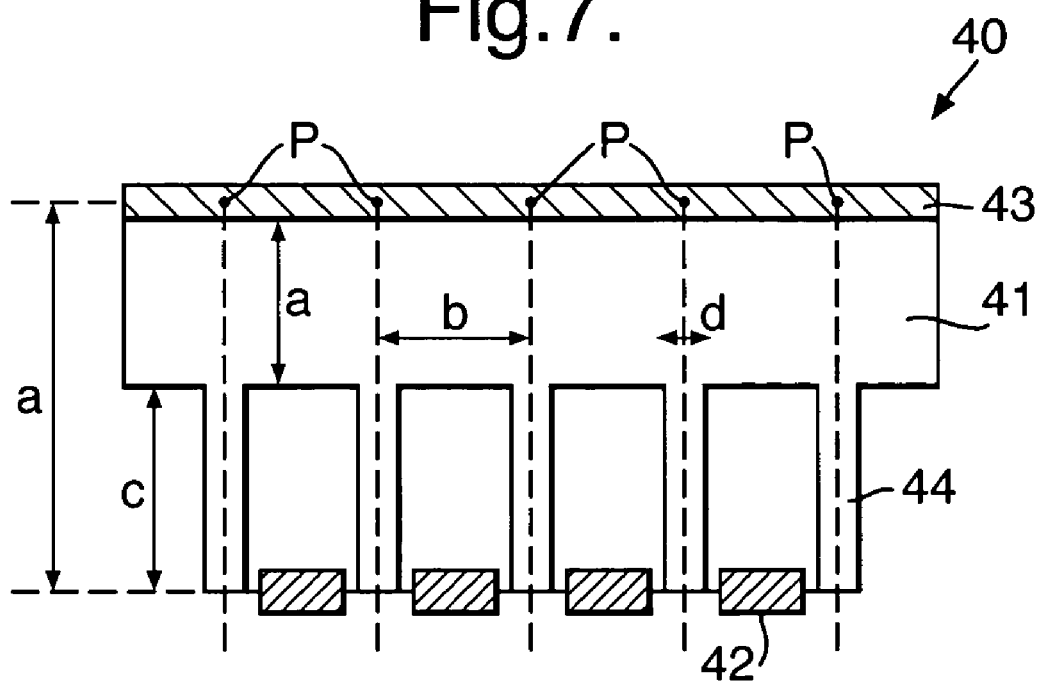
FIG. 7 is a cross-sectional view of an active mirror used in a third embodiment of the invention.

In a third embodiment of the invention, which may be the same as the first or second one save as described below, torques are exerted to control the surface figure. FIG. 7 shows mirror 40 comprising a multilayer structure 43 presenting a reflective surface having the surface figure to be controlled. Multilayer structure 43 is provided on mirror body 41 provided with projections 44 that project in a direction opposed to and substantially perpendicular to the reflective surface. The projections are arranged in a two-dimensional array on the backside of mirror 40. They need not be an integral part of mirror body 41, as shown in FIG. 7, but may also take the form of rods that are inserted in respective holes provided in the mirror body.

Actuators 42 are provided to exert a force on the projections at a distance D from the reflective surface so as to exert a torque around a point P on or near the reflective surface. A larger distance D implies a larger torque at an equal force. The torque will bend the reflective surface for controlling its surface figure. The forces exerted on the projections 44 will generally be predominantly parallel to the surface figure of reflective multilayer 43.

Forces may be exerted in between a separate reaction plate and each projection 44, but are in the embodiment shown exerted in between two projections 44. The latter arrangement does not require a reaction plate. FIG. 7 shows an actuator 42 inserted in between neighboring projections, but may also be put in between projections that are further apart. Actuators 42 may be rod-like actuators acting along their lengths as discussed for the second embodiment. Contraction of such an actuator will induce an outward directed (convex) curvature of the surface figure and expansion will induce an inward directed (concave) curvature of the surface figure in between and around those projections on which the actuator is acting. The amount of curvature will be dependent on the thickness a of mirror body 41, the distance b between projections and the length c and thickness d of the projections.

Figure 8:
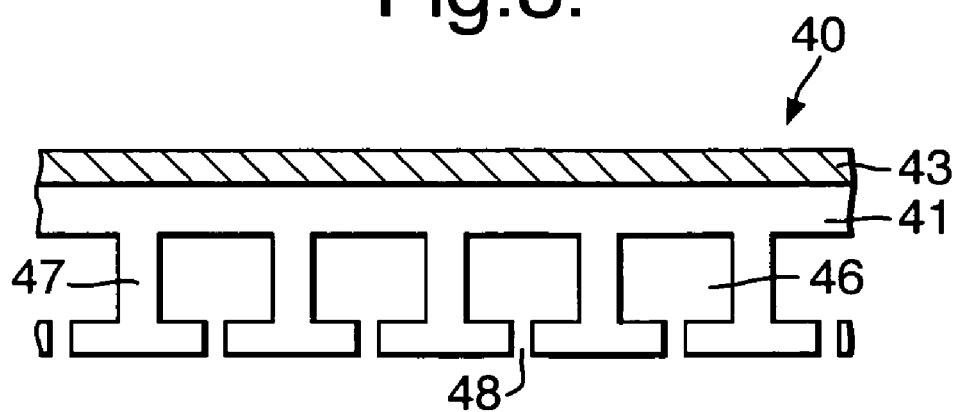
FIG. 8 is a cross-sectional view of an active mirror used in a variation of the third embodiment of the invention.

FIG. 8 shows a variation of the third embodiment, which comprises cavities 46 on the backside of mirror body 41. A gas (or liquid) having a certain (pneumatic or hydraulic) pressure may be put in the cavities to provide pneumatic (or hydraulic) actuators acting on walls 47 of the cavities. Those walls are equivalent to the projections as discussed above. Pressure differences between neighboring cavities will exert a force on their separating wall so as to exert a torque on the reflective surface of the mirror for controlling its surface figure. Like parameters a to d as discussed above will influence the amount of curvature. A control system will control pressures in the various cavities arranged on the backside of the active reflector by supplying an appropriate amount of fluid (gas and/or liquid) through openings 48 to cavities 47. The cavities and their separating walls (projections) may be arranged in a regular (two-dimensional) array.

While specific embodiments of the invention have been described above, it will be appreciated that the invention may be practiced otherwise than as described. The description is not intended to limit the invention.

What claimed is:

1. An active reflector comprising:
a body member,
a reflective multilayer coupled to said body member, and
at least one actuator coupled to at least one of said reflective multilayer and said body member,
wherein said actuator is operable to exert a force having a component in a direction parallel to a surface figure of said reflective multilayer to adjust the surface figure of said reflective multilayer.

2. An active reflector according to claim 1, wherein said actuator is operable to apply force to at least one of said reflective multilayer and said body member such that a force component in a direction perpendicular to the plane of said reflecting multilayer is less than 50% of a total force exerted by said actuator.

3. An active reflector according to claim 2, wherein said force component in the direction perpendicular to the plane of said reflecting multilayer is less than 20% of the total force exerted by the actuator.

4. An active reflector according to claim 1, wherein said actuator is operable to apply a force to at least one of said reflective multilayer and said body member substantially only in directions parallel to the plane of said reflecting multilayer.

5. An active reflector according to claim 1, wherein said actuator is operative to apply a torque to at least one of said reflective multilayer and said body member.

6. An active reflector according to claim 5, wherein said actuator is operative to apply a torque about a point in or near said reflective multilayer.

7. An active reflector according to claim 1, further comprising:
a first projection at a back side of said body member opposing said reflective multilayer,
wherein said actuator is mechanically linked to said first projection so as to exert a torque about a point in or near said reflective multilayer.

8. An active reflector according to claim 7, further comprising:
a second projection at a back side of said body member opposing said reflective multilayer,
wherein said actuator is further mechanically linked to said second projection so as to exert a torque about a point in or near said reflective multilayer.

9. An active reflector according to claim 8, wherein said first projection and said second projection are spaced apart from each other and said actuator is interposed between said first projection and said second projection.

10. An active reflector according to claim 9, wherein a contraction of said actuator induces an outward curvature of the surface figure of at least a portion of said reflective multilayer and an expansion of actuator induces an inward curvature of the surface figure of at least a portion of said reflective multilayer.

11. An active reflector according to claim 8, wherein a length of said first projection and said second projection is selected to effect an amount of curvature of the surface figure of at least a portion of said reflective layer.

12. An active reflector according to claim 8, wherein a thickness of said first projection and said second projection is selected to effect an amount of curvature of the surface figure of at least a portion of said reflective layer.

13. An active reflector according to claim 8, wherein a distance between said first projection and said second projection is selected to effect an amount of curvature of the surface figure of at least a portion of said reflective layer.

14. An active reflector according to claim 8, wherein a thickness of said body member is selected to effect an amount of curvature of the surface figure of at least a portion of said reflective layer.

15. An active reflector according to claim 8, wherein an amount of force exerted on at least one of said first projection and said second projection effects an amount of curvature of the surface figure of at least a portion of said reflective layer.

16. An active reflector according to claim 7, further comprising:
a second projection at a back side of said body member opposing said reflective multilayer,
wherein said first projection and said second projection define walls of a cavity.

17. An active reflector according to claim 16, wherein at least one of a length and a thickness of said first projection and said second projection effects an amount of curvature of the surface figure of at least a portion of said reflective layer.

18. An active reflector according to claim 16, wherein a distance between said first projection and said second projection effects an amount of curvature of the surface figure of at least a portion of said reflective layer.

19. An active reflector according to claim 1, further comprising a plurality of actuators arranged in an array.

20. An active reflector according to claim 1, wherein said actuator comprises a piezoelectric actuator.

21. An active reflector according to claim 1, wherein said actuator comprises one of a pneumatic and a hydraulic actuator.

22. An active reflector according to claim 1, wherein said reflective multilayer has a higher in-plane stiffness than out-of-plane stiffness.

23. An active reflector according to claim 1, wherein optical aberrations in said reflective multilayer are correctable by adjusting the surface figure of said reflective multilayer.

24. An active reflector according to claim 1, further comprising:
a plurality of actuators connected to at least one of said reflective multilayer and said body member at a plurality of points,
wherein said plurality of points are spread in a matrix arrangement over substantially a whole surface of at least one of said reflective multilayer and said body member and said plurality of actuators are operable to exert a force having a component in a direction parallel to a surface figure of said reflective multilayer to adjust the surface figure of said reflective multilayer.

25. An active reflector according to claim 1, wherein said reflective multilayer is configured to reflect radiation in the ultraviolet spectrum.

26. An active reflector comprising:
a body member;
a reflective multilayer coupled to said body member; and
a first projection and a second projection at a back side of said body member opposing said reflective multilayer, said first projection and said second projection define walls of a cavity,
wherein said cavity is adapted to contain a fluid so as to exert one of a pneumatic force and a hydraulic force on at least one of said first projection and said second projection to control a surface figure of said reflective multilayer.

27. An active reflector according to claim 26, wherein at least one of a length and a thickness of said first projection and said second projection effects an amount of curvature of the surface figure of at least a portion of said reflective multilayer.

28. An active reflector according to claim 26, wherein a distance between said first projection and said second projection effects an amount of curvature of the surface figure of at least a portion of said reflective multilayer.

29. An active reflector according to claim 26, wherein a thickness of said body member effects an amount of curvature of the surface figure of at least a portion of said reflective multilayer.

30. An active reflector comprising:
a body member:
a reflective multilayer coupled to said body member; and
a plurality of actuators arranged in an array, said plurality of actuators being coupled to at least one of said reflective multilayer and said body member,
wherein said plurality of actuators are arranged in two arrays of oppositely inclined actuators, and said plurality of actuators are operable to exert a force having a component in a direction parallel to a surface figure of said reflective multilayer to adjust the surface figure of said reflective multilayer.

31. An active reflector according to claim 30, wherein two oppositely inclined actuators in said two arrays of oppositely inclined actuators are connected to the reflective multilayer at a same point.

32. An active reflector according to claim 31, wherein one of said two actuators exerts a first force on said reflective multilayer and another one of said two actuators exerts a second force on said reflective multilayer such that a resultant force of said first force and said second force is substantially parallel to a surface figure of said reflective multilayer.

33. An active reflector according to claim 31, wherein at least one actuator in said plurality of actuators exerts a force perpendicular to said reflective multilayer, said perpendicular force compensating for components of forces which are perpendicular to said reflective multilayer.

34. An active reflector according to claim 30, further comprising a perpendicular actuator arranged to compensate for perpendicular components of forces exerted perpendicular to said reflective multilayer by the oppositely inclined actuators.

* * * * *